United States Patent
Luo et al.

(10) Patent No.: US 7,482,656 B2
(45) Date of Patent: Jan. 27, 2009

(54) METHOD AND STRUCTURE TO FORM SELF-ALIGNED SELECTIVE-SOI

(75) Inventors: Zhijiong Luo, Carmel, NY (US); Yung Fu Chong, Singapore (SG); Kevin K Dezfulian, Mount Kisco, NY (US); Huilong Zhu, Poughkeepsie, NY (US); Judson R Holt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/421,594

(22) Filed: Jun. 1, 2006

(65) Prior Publication Data
US 2007/0278591 A1 Dec. 6, 2007

(51) Int. Cl.
*H01L 29/76* (2006.01)
(52) U.S. Cl. ............... 257/347; 257/510; 257/E29.02; 257/E29.021; 257/E29.277; 257/E29.297; 438/211
(58) Field of Classification Search ............... 257/347, 257/510; 438/221
See application file for complete search history.

(56) References Cited

U.S. PATENT DOCUMENTS

| | | | |
|---|---|---|---|
| 5,143,862 A | 9/1992 | Moslehi | |
| 5,955,767 A | 9/1999 | Liu et al. | |
| 6,271,566 B1 * | 8/2001 | Tsuchiaki | 257/347 |
| 6,316,296 B1 | 11/2001 | Sakamoto | |
| 6,936,522 B2 | 8/2005 | Steegen et al. | |
| 6,958,516 B2 | 10/2005 | Wong | |
| 2003/0197224 A1 * | 10/2003 | Song et al. | 257/348 |
| 2003/0234422 A1 * | 12/2003 | Wang et al. | 257/336 |
| 2005/0151193 A1 | 7/2005 | Wong | |
| 2006/0060856 A1 * | 3/2006 | Anderson et al. | 257/66 |
| 2006/0084235 A1 * | 4/2006 | Barr et al. | 438/300 |
| 2006/0115941 A1 * | 6/2006 | Shin | 438/197 |
| 2006/0131657 A1 * | 6/2006 | Hamaguchi | 257/369 |
| 2006/0289907 A1 * | 12/2006 | Kim et al. | 257/288 |

* cited by examiner

*Primary Examiner*—Ahmed Sefer
(74) *Attorney, Agent, or Firm*—Rosa Suazo Yaghmour; Hoffman Warnick LLC

(57) ABSTRACT

Methods of forming a self-aligned, selective semiconductor on insulator (SOI) structure and a related structure are disclosed. In one embodiment, a method includes providing a substrate; forming a gate structure over a channel within the substrate; recessing a portion of the substrate adjacent the channel; forming an insulating layer on a bottom of the recessed portion; and forming a semiconductor material above the insulating layer. An upper surface of the semiconductor material may be sloped. A MOSFET structure may include a substrate; a channel; a source region and a drain region adjacent the channel; a gate structure above the channel and the substrate; a shallow trench isolation (STI) distal from the gate structure; a selectively laid insulating layer in at least one of the source region and the drain region; and an epitaxially grown semiconductor material above the selectively laid insulating layer.

18 Claims, 9 Drawing Sheets

US 7,482,656 B2

METHOD AND STRUCTURE TO FORM SELF-ALIGNED SELECTIVE-SOI

BACKGROUND OF THE INVENTION

1. Technical Field

The invention relates generally to semiconductor device fabrication, and more particularly, to methods of constructing a selective semiconductor-on-insulator (SOI) structure that has self-aligning attributes amongst its various parts, and a related structure.

2. Background Art

Semiconductor-on-insulator (SOI) substrate wafers (or, "SOI structure") are a known improvement over conventional bulk wafers for both solving the problem of electrical isolation between adjacent devices and also allowing for more complicated layout designs. Due to its reduced junction capacitance, a metal-oxide-field effect transistor (MOSFET) structure employing the SOI structure also results in improved circuit switching speed. However, the SOI structure also has a drawback of lacking any body contact, which results in several adverse effects, such as the floating body effect and the history effect. The floating body effect allows a dynamic lowering of the threshold voltage which may create a history effect which includes a propagation delay of a gate, depending on what happened to the gate beforehand. A SOI structure typically includes a thin layer of silicon oxide ("oxide layer") inserted into, and thus buried within, a silicon substrate.

A species of SOI construction that is gaining favor is selective SOI which may include the selective formation of the buried oxide layer, wherein the buried oxide layer is not necessarily continuous and uninterrupted laterally along the substrate as with "traditional" SOI construction, hence the term "selective". By inserting the buried oxide layer only underneath the source/drain area, the selective SOI structure can maintain the benefits of a traditional SOI structure, while eliminating the drawbacks of a traditional SOI structure that are due to the lack of a body contact.

However, as with traditional SOI construction, selective SOI suffers from various shortcomings. For example, with the ongoing scaling down of dimensions in fabrication (e.g., ever smaller channel length, etc.), it is increasingly difficult to properly align the selective SOI structure only in the source/drain region. This misalignment, or lack of self-alignment, of the various elements within a selective SOI structure is undesirable. Performance may be degraded and device-to-device variation may increase as a result. Another shortcoming is that the formation of gate structures and adjacent implanted oxide layers are typically imperfect. This problem arises regardless of whether the buried oxide layer is inserted via the separation by implantation of oxygen (SIMOX) method, or via other available methods.

In view of the foregoing, there is a need in the art for a solution to the problems of the related art.

SUMMARY OF THE INVENTION

Methods of forming a self-aligned, selective semiconductor on insulator (SOI) structure and a related structure are disclosed. In one embodiment, a method includes providing a substrate; forming a gate structure over a channel within the substrate; recessing a portion of the substrate adjacent the channel; forming an insulating layer on a bottom of the recessed portion; and forming a semiconductor material above the insulating layer. An upper surface of the semiconductor material may be sloped. A MOSFET structure may include a substrate; a channel; a source region and a drain region adjacent the channel; a gate structure above the channel and the substrate; a shallow trench isolation (STI) distal from the gate structure; a selectively laid insulating layer in at least one of the source region and the drain region; and an epitaxially grown semiconductor material above the selectively laid insulating layer.

A first aspect of the invention provides a method of fabricating a MOSFET structure, comprising: providing a substrate; forming a gate structure over a channel within the substrate; recessing a portion of the substrate adjacent the channel; forming an insulating layer on a bottom of the recessed portion; and forming a semiconductor material above the insulating layer.

A second aspect of the invention provides a method for forming an insulating region in a source/drain region in a MOSFET structure fabrication process, the MOSFET structure having a gate structure on a substrate and a region in the substrate adjacent the gate structure, the method comprising the steps of: removing a portion of the region in the substrate adjacent the gate structure; depositing a non-conformal coating material in the portion of the region removed; exposing a substantially vertical surface of the substrate adjacent a channel; forming a semiconductor material above the non-conformal coating material; and forming a silicide above the semiconductor material.

A third aspect of the invention provides a MOSFET structure comprising: a substrate; a channel; a source region and a drain region adjacent the channel; a gate structure above the channel and the substrate; a shallow trench isolation (STI) distal from the gate structure; a selectively laid insulating layer in at least one of the source region and the drain region; and an epitaxially grown semiconductor material above the selectively laid insulating layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
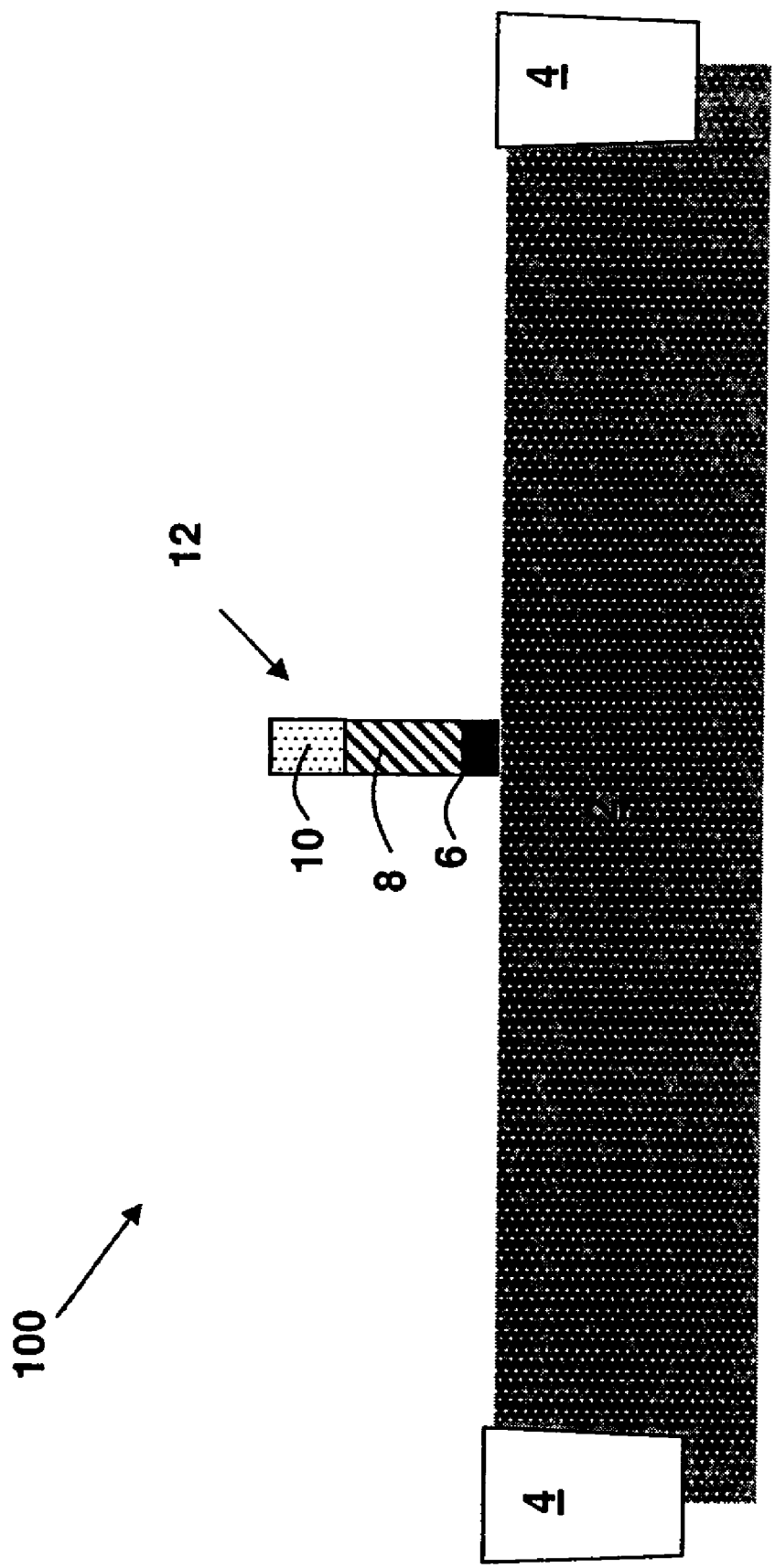
FIGS. 1-8 show cross-sectional views of one embodiment of a method according to the invention.

Referring to the drawings, FIG. 1 shows an initial structure 100 for methods according to various embodiments of the invention. Initial structure 100 may, for example, include one or more shallow trench isolation (STI) regions 4 interspersed upon a substrate 2. Formed between STI regions 4 may be a gate dielectric 6 and a polysilicon gate 8 thereon. Optionally, a silicon nitride cap 10, which offers added flexibility, may be provided on polysilicon gate 8. A gate stack 12 including gate dielectric 6, polysilicon gate 8, and nitride cap 10 may be formed using, for example, a reactive ion etch (RIE) (not shown). A nFET structure (n-type channel MOSFET) 100 or a pFET structure (p-type channel MOSFET) 100 (see e.g., FIG. 9) may be formed from methods herein.

Substrate 2 may include, for example, silicon, silicon-on-insulator (SOI), or other suitable semiconductor substrate materials, now known or later developed.

Figure 2:
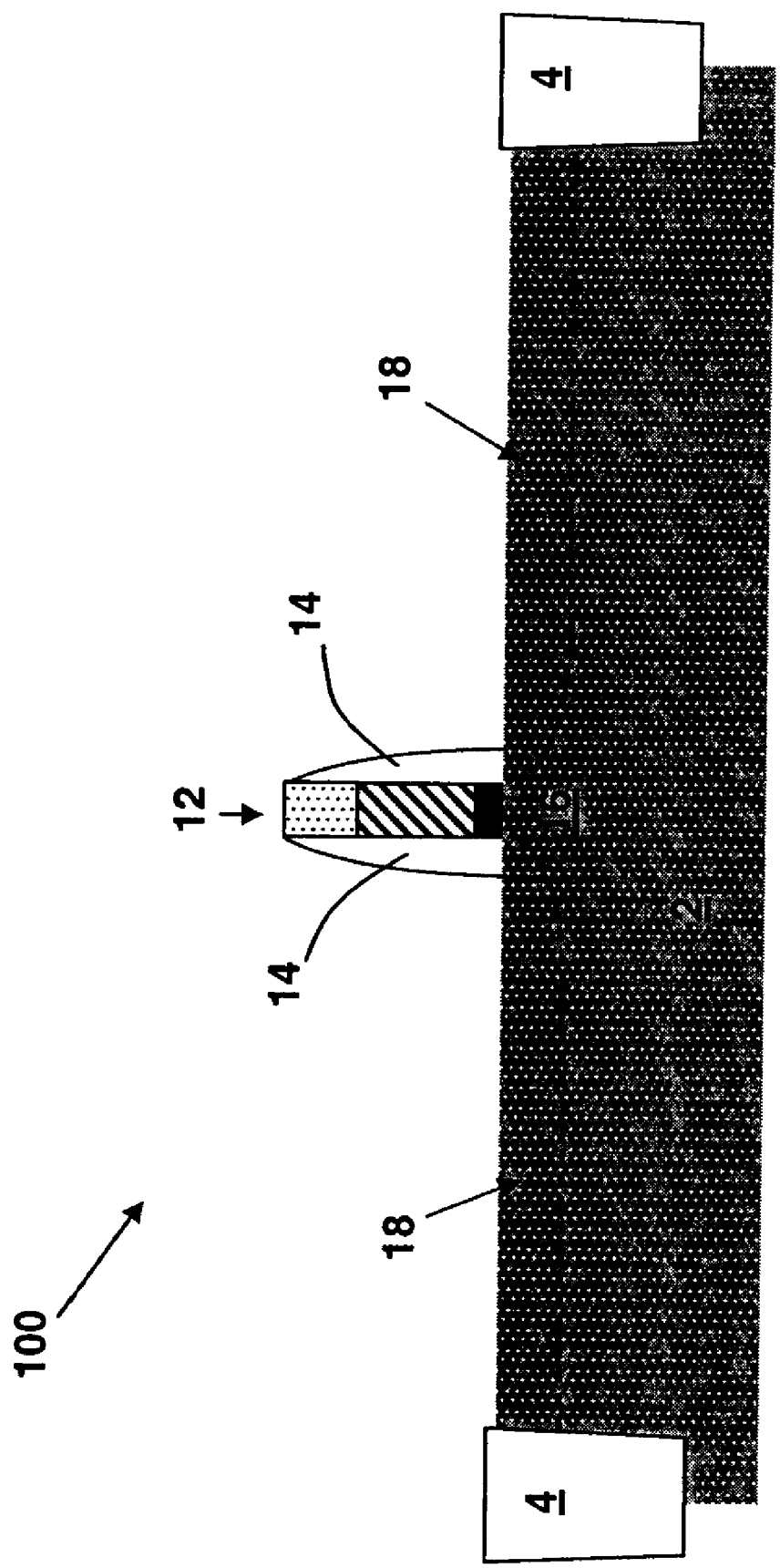
Figure 3:
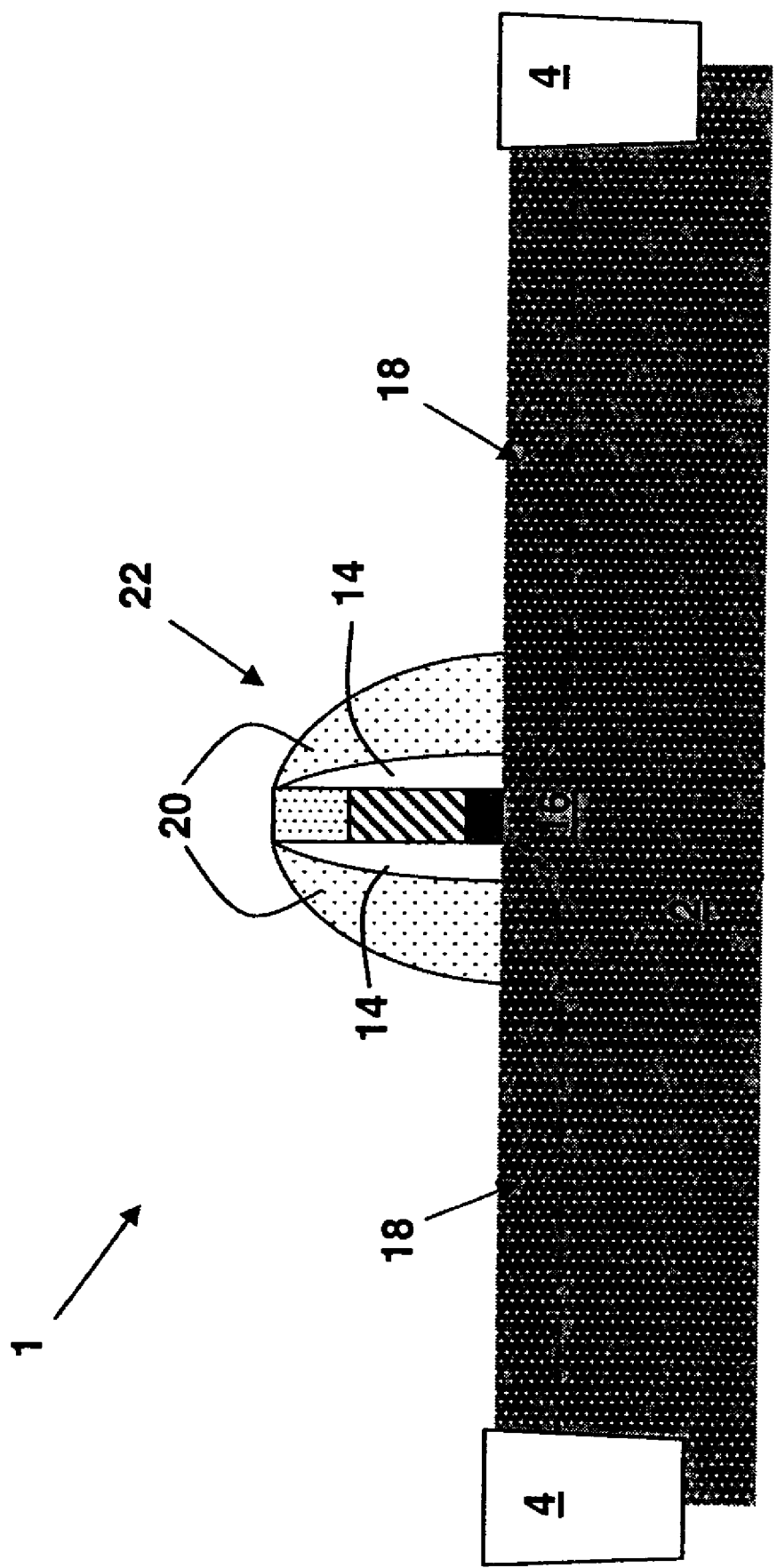

Turning to FIGS. 2-3, a next step of the method includes forming a first spacer 14 around gate stack 12 and forming a second spacer 20 around first spacer 14. Extension and halo implants are formed for either nFET or pFET structures 100 (FIG. 8) after forming first spacer 14. A region 18 is thereby formed between gate structure 22 (and channel 16 below) and distally located STI region 4.

Forming of first spacer 14 may include depositing silicon oxide or silicon nitride, or thermally growing silicon oxide. A RIE process may be used to form first spacer 14. Second spacer 20 may be formed by similar means and methods now known, or later developed.

Figure 4:
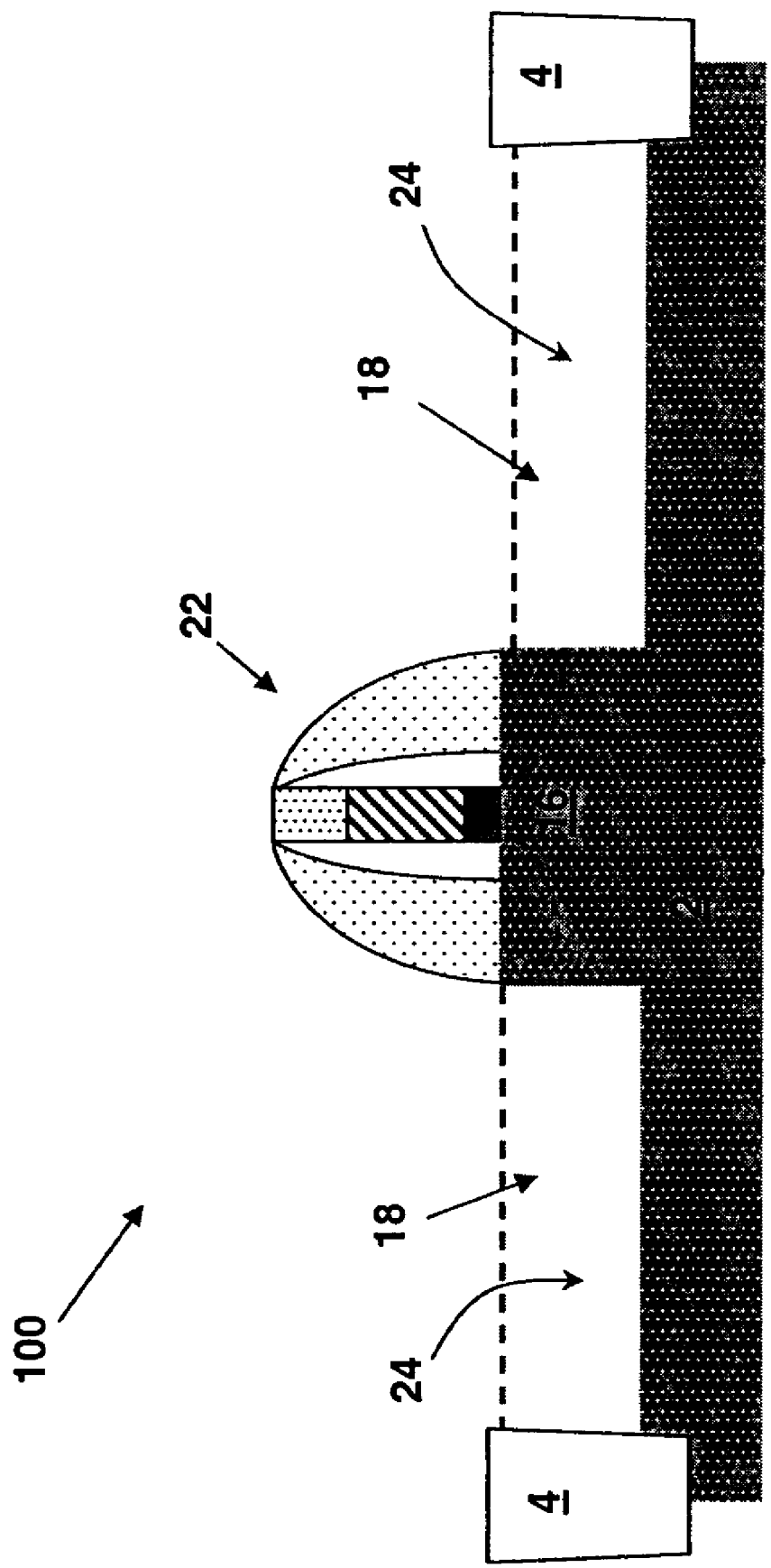

As shown in FIG. 4, a next step may include removing a portion 24 of region 18 (see e.g., dotted line). The removing may include recessing a portion of substrate 2 in the area of region 18 so as to expose a substantially vertical surface on STI region 4 and channel 16. The removing may include, for example, applying a RIE process. Depth of removal may, for example, be in a range from approximately 100 angstrom to approximately 2,000 angstrom deep.

Figure 5:
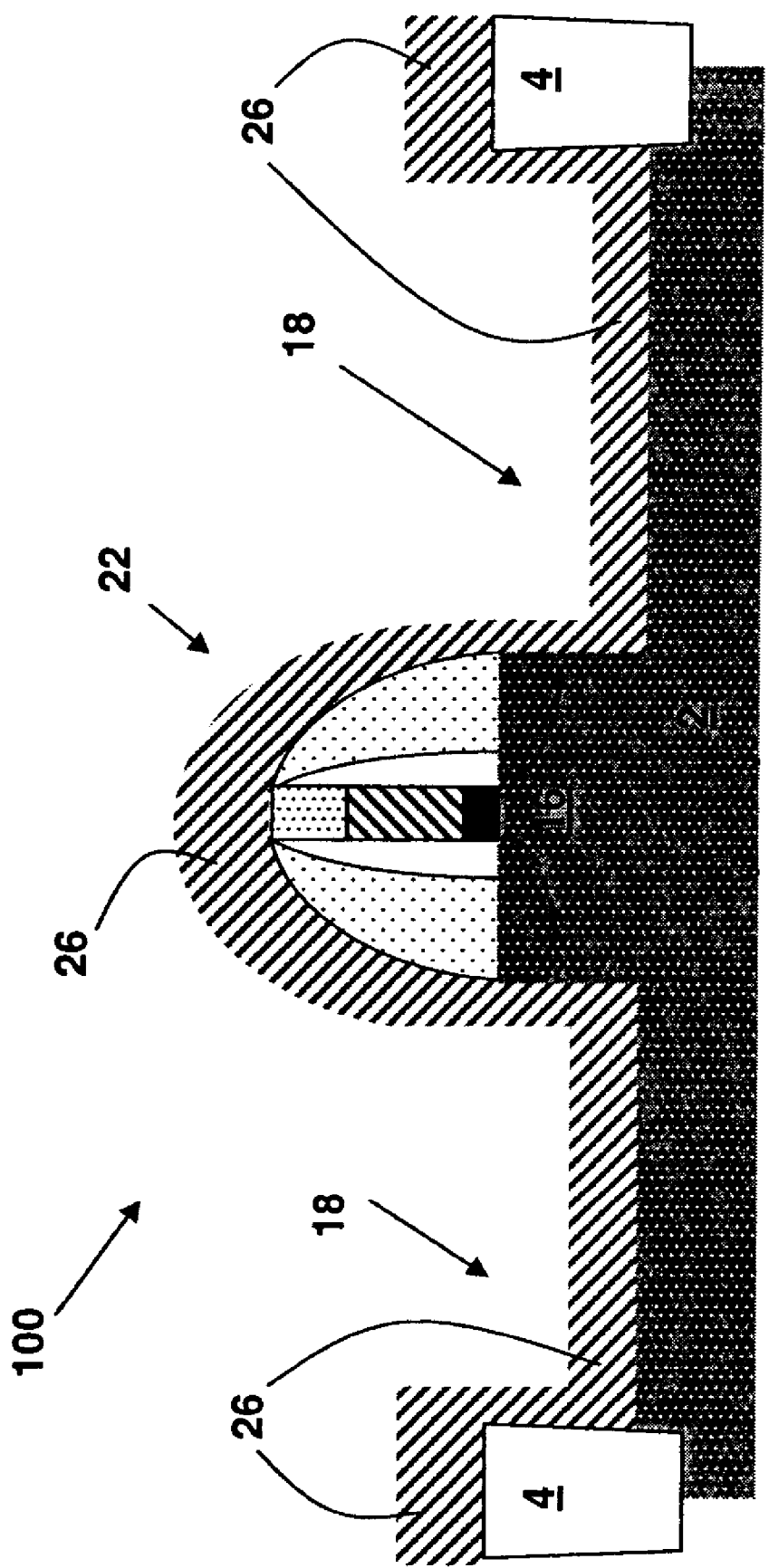

Next, as shown in FIG. 5, an insulating layer 26 is formed over substrate 2, including, for example, in region 18 after the aforementioned removal. Insulating layer 26 may include a deposition of a non-conformal coating material, such as high plasma density (HDP) silicon oxide ($SiO_2$), HDP silicon nitride ($Si_3N_4$), or other suitable insulating materials. Thickness of insulating layer 26 may be, for example, from approximately 1 nm to approximately 100 nm. Insulating layer 26 is typically thicker on lateral surfaces than on vertical surfaces. As shown, insulating layer 26 may be further formed over whole substrate 2, such as on various vertical and horizontal surfaces of structure 100, such as over STI region 4, over gate structure 22, and other areas (not shown).

Figure 6:
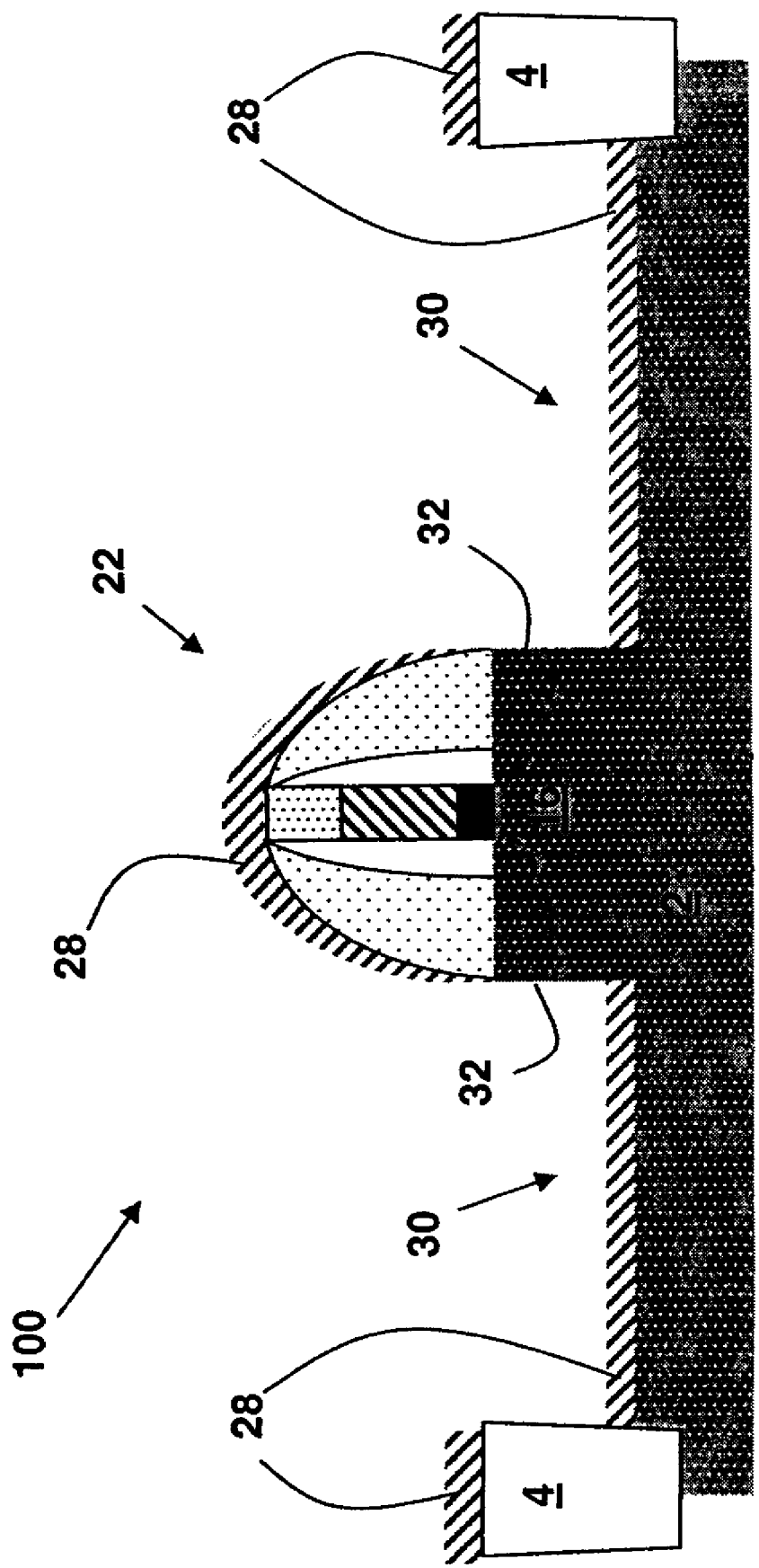

FIG. 6 shows a next step in which portions of insulating layer 26 (FIG. 5) are selectively removed such that no residue of insulating layer 26 (FIG. 5) remains on a sidewall 32 of a recessed source/drain region 30, thereby exposing a vertical surface (e.g. sidewall 32) of substrate 2 at channel 16. Removal of a portion of insulating layer 26 (FIG. 5) may also, for example, include removing insulating layer 26 (FIG. 5) on vertical surfaces of STI regions 4 due to the conformal nature of insulating layer 26 (FIG. 5) (e.g., generally, it is thicker on lateral surfaces and thinner on vertical surfaces). An isotropic RIE or wet etch process may be used as part of the removal process. Removal of insulating layer 28 is less than full so that a bottom of region 18 is still covered by a remaining insulating layer 28 to a depth of at least approximately 1 nm. Horizontal (i.e., lateral) surfaces such as a top of STI regions 4 and an upper portion of gate structure 22, may also still have insulating layer 28 remaining after this step.

Figure 7:
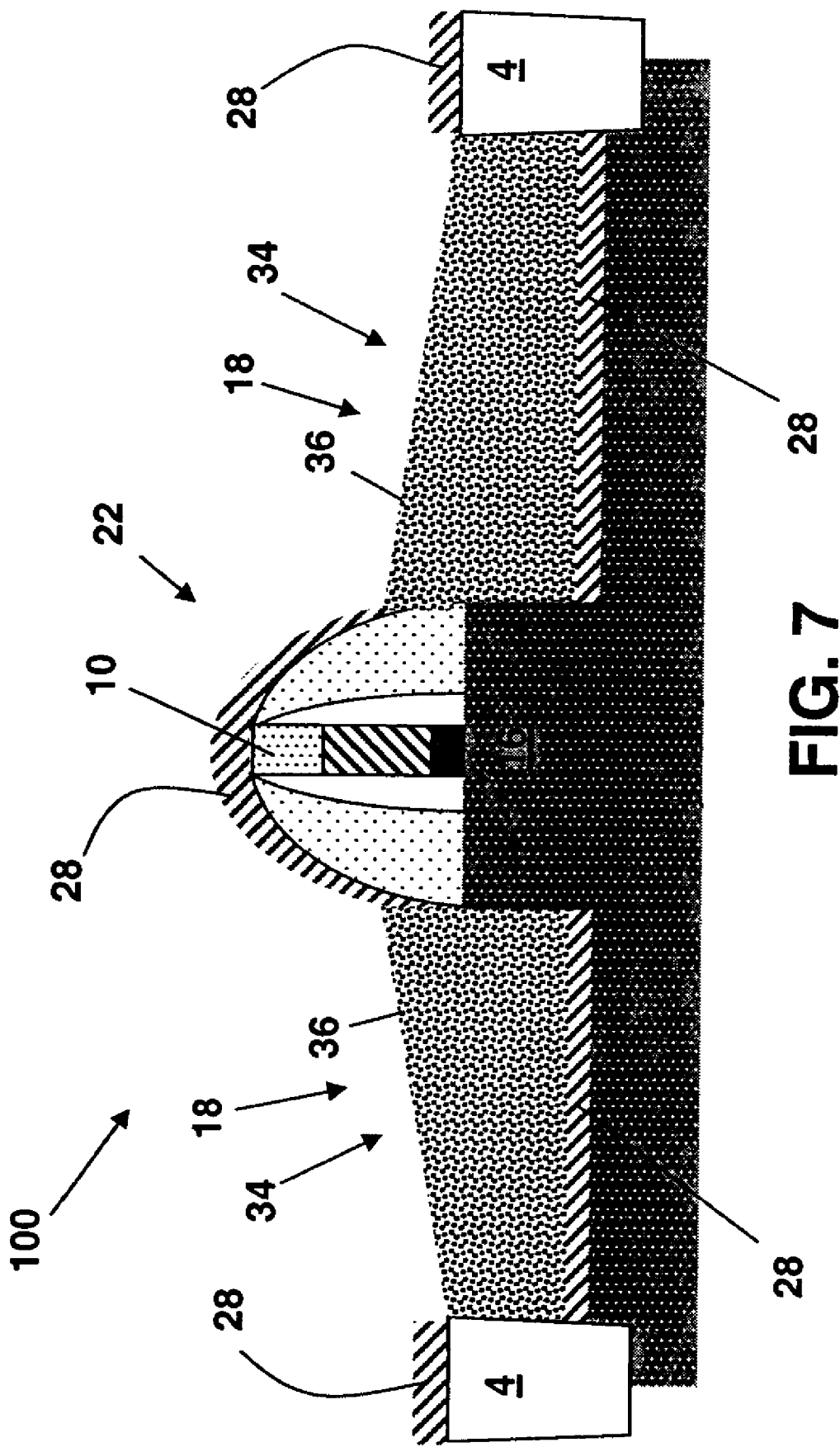

FIG. 7 shows a next step in which a silicon material 34 is formed above insulating layer 28 in region 18, adjacent channel 16. Forming of silicon material 34 may include employing a lateral epitaxy process, thereby forming silicon (Si), silicon germanium (SiGe), or silicon carbon (SiC) from sidewall 32 (FIG. 6) of channel 16. For example, epitaxially grown silicon germanium (SiGe) is suitable for p-type MOSFET, and silicon carbon (SiC) is suitable for n-type MOSFET. Silicon material 34 may be in situ doped, if desired. An upper surface 36 of silicon material 34 may be sloped (i.e., non-level) so as to slope from an upper end, adjacent gate structure 22, to a lower end, adjacent STI region 4.

Figure 8:
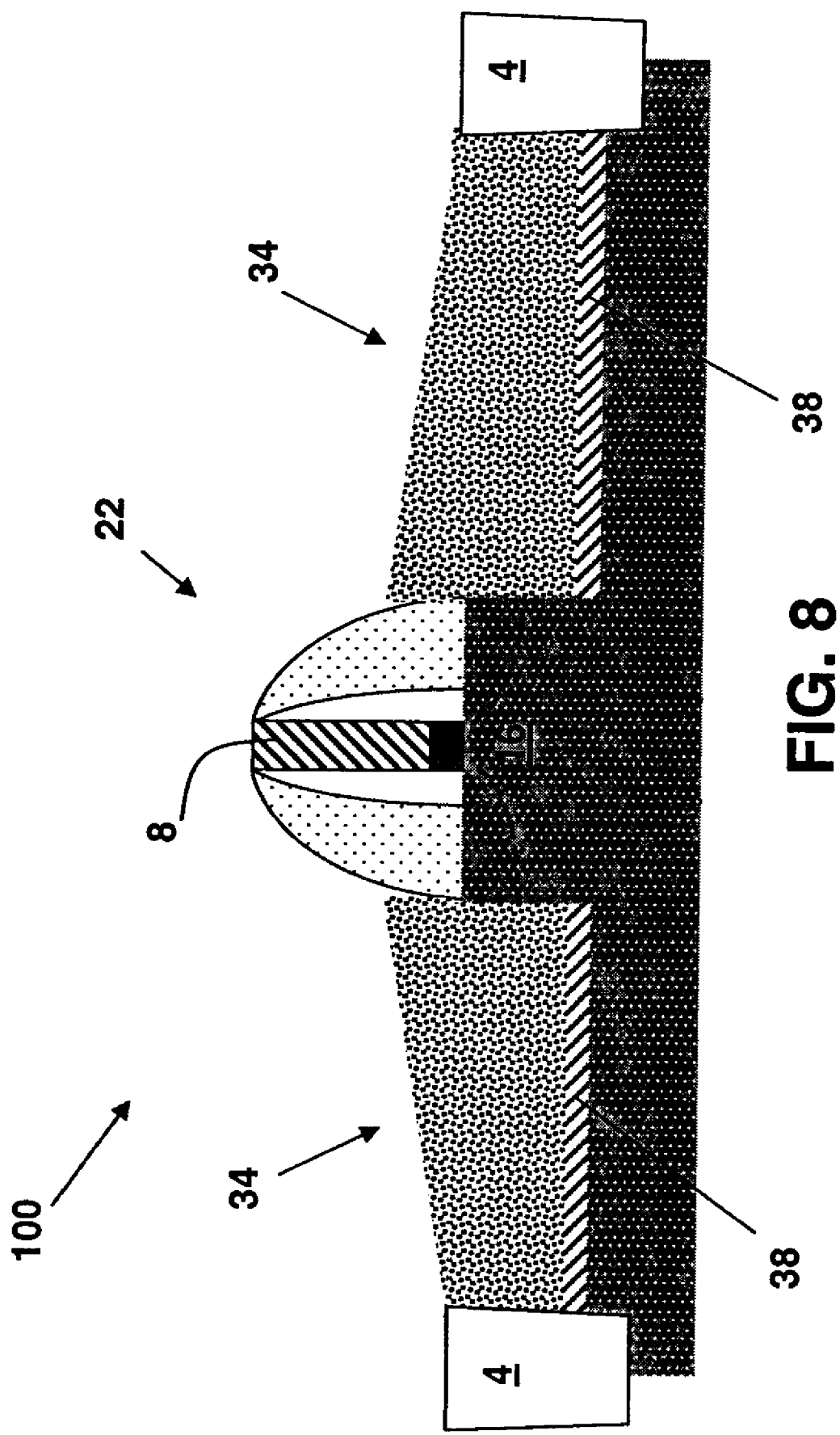

FIG. 8 shows the next step of removing any remaining insulating layer 28 (FIG. 7) over gate structure 22 and STI regions 4, as well as, over nitride cap 10 (FIG. 7), if applicable. As a result, insulating layer 38 remains underneath formed silicon material 34.

Implant n-type dopant into n-type MOSFET, and implant p-type dopant into p-type MOSFET may be used to form source/drain junctions. Additional high temperature annealing (e.g., >800° C.) typically follows, as well (not shown).

Figure 9:
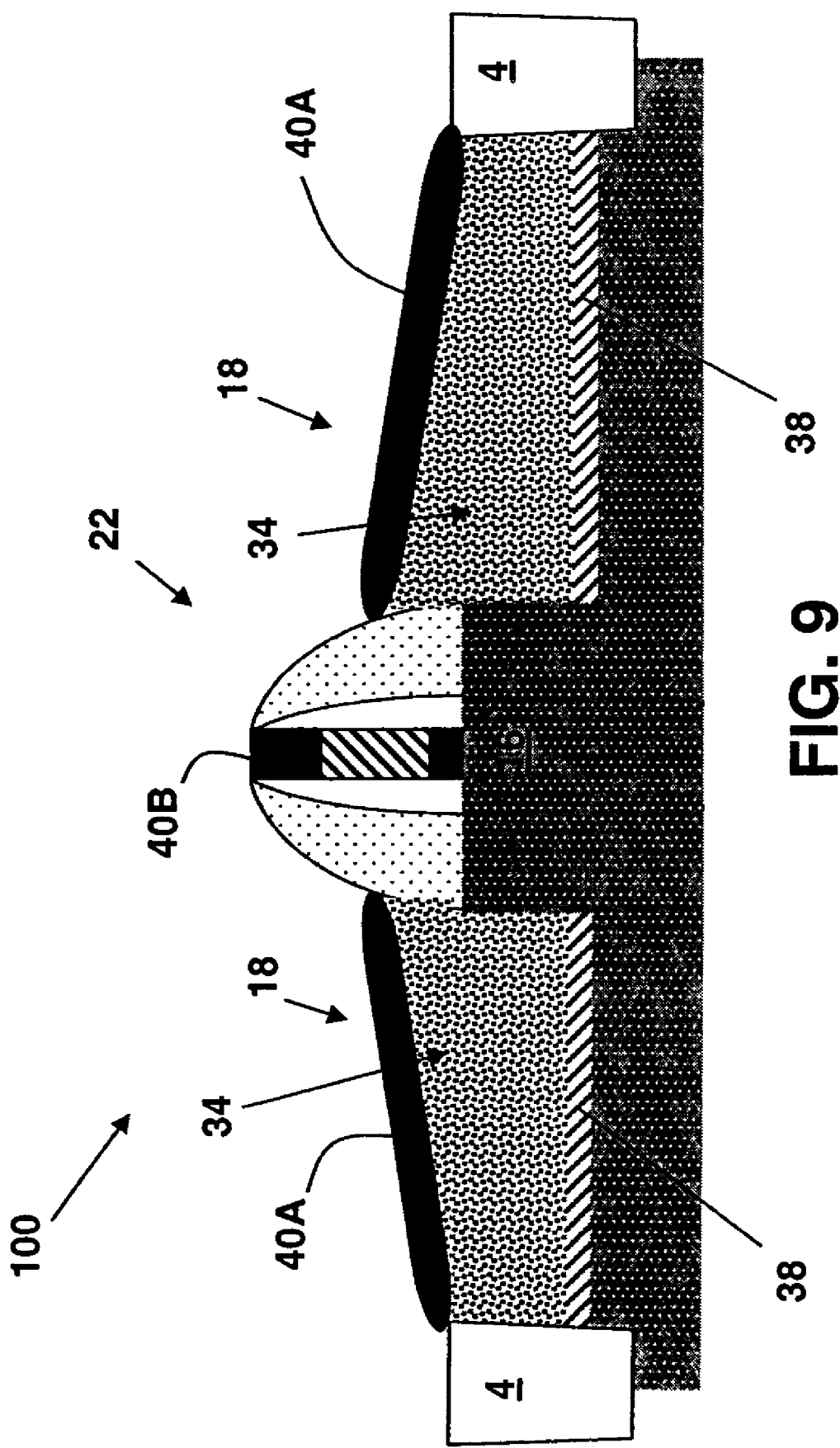
FIG. 9 shows a cross-sectional view of one embodiment of a structure according to the invention.

A final step is shown in FIG. 9 wherein a silicide 40A may be formed over silicon material 34 in region 18, and silicide 40B may be formed on gate structure 22. Now known or later developed processes are employed in forming silicide 24, wherein silicide 24 may include nickel silicide ($NiSi_2$), cobalt silicide ($Co\ Si_2$), tungsten silicide (WSi), titanium silicide (TiSi), and the like.

The above-described methods, inter alia, form a MOSFET structure 100 that self-aligns various elements within a selective SOI structure 100. That is by selectively laying insulating layer 18 into place (i.e., region 18), after recessing of region 18 step, certain elements (i.e., insulating layer 38, silicon 34) stay in desirable vertical alignment with each other and concomitantly other elements (i.e., gate structure 22, channel 16) stay in desirable vertical alignment with each other, as well. In this manner, these aforementioned elements are self-aligning. Ultimately, performance of the MOSFET structure 100 is improved, making for an improved method of construction a novel type of selective SOI structure.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of fabricating a MOSFET structure, comprising:

providing a substrate;

forming a gate structure over a channel within the substrate;

recessing a portion of the substrate adjacent the channel;

forming an insulating layer on a bottom of the recessed portion;

selectively removing a portion of the insulating layer thereby exposing a vertical surface at the channel, wherein a remaining insulating layer covers all horizontal surfaces of the recessed portion to a depth of at least approximately 1 nm; and forming a semiconductor material above the remaining insulating layer, wherein an upper surface of the semiconductor material forms a substantially planar slope from an upper end adjacent the gate structure to a lower end adjacent a shallow trench isolation (STI) region, and wherein the remaining insulating layer separates the semiconductor material from the substrate on all horizontal surfaces.

2. The method of claim 1, wherein the insulating layer is selected from a group consisting of silicon oxide and silicon nitride.

3. The method of claim 1, forming the gate structure further comprises forming at least one spacer around a gate stack prior to the recessing.

4. The method of claim 1, wherein the recessing includes etching a portion of the substrate.

5. The method of claim 1, wherein the recessing includes removing a portion of the substrate to a depth of approximately 100 angstrom to approximately 2,000 angstrom.

6. The method of claim 1, wherein a thickness of the insulating layer is at least approximately 1 nm.

7. The method of claim 1, wherein the semiconductor material forming includes employing a lateral epitaxy process adjacent the channel.

8. The method of claim 1, further comprising:
forming a silicide above the semiconductor material.

9. The method of claim 1, further comprising etching a sidewall adjacent the channel.

10. A method for forming an insulating region in a source/drain region in a MOSFET structure fabrication process, the MOSFET structure having a gate structure on a substrate and a region in the substrate adjacent the gate structure, the method comprising the steps of:

removing a portion of the region in the substrate adjacent the gate structure;

depositing a non-conformal coating material in the portion of the region removed;

selectively removing a portion of the non-conformal coating material thereby exposing a substantially vertical surface of the substrate adjacent a channel, wherein a remaining non-conformal coating material covers all horizontal surfaces of the recessed portion to a depth of at least approximately 1 nm;

forming a semiconductor material above the remaining non-conformal coating material, wherein an upper surface of the semiconductor material forms a substantially planar slope from an upper end adjacent the gate structure to a lower end adjacent a shallow trench isolation (STI) region, and wherein the remaining non-conformal coating material separates the semiconductor material from the substrate on all horizontal surfaces; and forming a silicide above the semiconductor material.

11. The method of claim 10, wherein the semiconductor material forming follows the exposing.

12. The method of claim 10, wherein the exposing includes performing one of a wet etch and an isotropic reactive ion etch (RIE).

13. The method of claim 10, wherein the non-conformal coating includes an insulator selected from a group consisting of: silicon oxide and silicon nitride.

14. The method of claim 10, wherein the semiconductor material forming includes employing a lateral epitaxy process.

15. The method of claim 10, wherein the semiconductor material is selected from a group consisting of: silicon (Si), silicon germanium (SiGe), and silicon carbon (SiC).

16. The method of claim 10, wherein the silicide forming includes forming a silicide on the gate structure.

17. The method of claim 10, wherein the depositing includes forming an insulating layer on a substantially horizontal surface of the substrate.

18. The method of claim 10, wherein the semiconductor material forming includes abutting the semiconductor material to the vertical surface of the substrate.

* * * * *

UNITED STATES PATENT AND TRADEMARK OFFICE
CERTIFICATE OF CORRECTION

PATENT NO. : 7,482,656 B2 Page 1 of 1
APPLICATION NO. : 11/421594
DATED : January 27, 2009
INVENTOR(S) : Zhijiong Luo et al.

It is certified that error appears in the above-identified patent and that said Letters Patent is hereby corrected as shown below:

On the title page, item (73) Assignee: Please Delete "International Business Machines Corporation, Armonk, NY (US)" and Insert -- International Business Machines Corporation, Armonk, NY (US) and Chartered Semiconductor Manufacturing LTD, Singapore (SG) --.

Signed and Sealed this

Twenty-second Day of December, 2009

David J. Kappos
*Director of the United States Patent and Trademark Office*